(12) United States Patent
Miyachi

(10) Patent No.: US 8,094,840 B2
(45) Date of Patent: Jan. 10, 2012

(54) THERMAL SOUND GENERATING DEVICE

(75) Inventor: Mamoru Miyachi, Saitama (JP)

(73) Assignee: Pioneer Corporation, Tokyo (JP)

( * ) Notice: Subject to any disclaimer, the term of this patent is extended or adjusted under 35 U.S.C. 154(b) by 378 days.

(21) Appl. No.: 12/439,747

(22) PCT Filed: Sep. 5, 2006

(86) PCT No.: PCT/JP2006/317568
§ 371 (c)(1),
(2), (4) Date: Mar. 26, 2009

(87) PCT Pub. No.: WO2008/029451
PCT Pub. Date: Mar. 13, 2008

(65) Prior Publication Data
US 2010/0054502 A1 Mar. 4, 2010

(51) Int. Cl.
*H04R 1/00* (2006.01)
(52) U.S. Cl. ........................................ 381/164
(58) Field of Classification Search .................. 381/164
See application file for complete search history.

(56) References Cited

U.S. PATENT DOCUMENTS

| 5,430,322 | A | 7/1995 | Koyanagi et al. |
| 6,391,676 | B1 | 5/2002 | Tsuzaki et al. |
| 2004/0227985 | A1* | 11/2004 | Kishi et al. ............ 359/296 |
| 2005/0201575 | A1 | 9/2005 | Koshida et al. |
| 2005/0248238 | A1* | 11/2005 | Yamada et al. ......... 310/366 |

FOREIGN PATENT DOCUMENTS

| EP | 1041651 | 4/2000 |
| GB | 2112565 | 7/1983 |
| JP | 02-073900 | 6/1990 |
| JP | 03-066182 | 3/1991 |
| JP | 03-140100 | 6/1991 |
| JP | 09-036438 | 2/1997 |
| JP | 11-300274 | 11/1999 |
| JP | 2002-186097 | 6/2002 |
| JP | 2003-154312 | 5/2003 |
| JP | 2004-193209 | 7/2004 |
| JP | 2005-150797 | 6/2005 |

OTHER PUBLICATIONS

English Translation of JP 2004-193209.*
International Search Report dated Dec. 8, 2008, Application No. PCT/JP2006/317568.
European Search Report issued on May 2, 2011, Application No. 06797468.3.

* cited by examiner

*Primary Examiner* — Victor A Mandala
*Assistant Examiner* — Whitney T Moore
(74) *Attorney, Agent, or Firm* — Young & Thompson

(57) ABSTRACT

A thermoacoustic generating apparatus (1) is for generating acoustic waves by temperature modulation of solids, and is provided with: a thermoelement layer (12); a first electrode layer (11), laminated on one surface of the thermoelement layer; and a second electrode layer (13), laminated on the other surface of the thermoelement layer.

12 Claims, 13 Drawing Sheets

[FIG. 1]
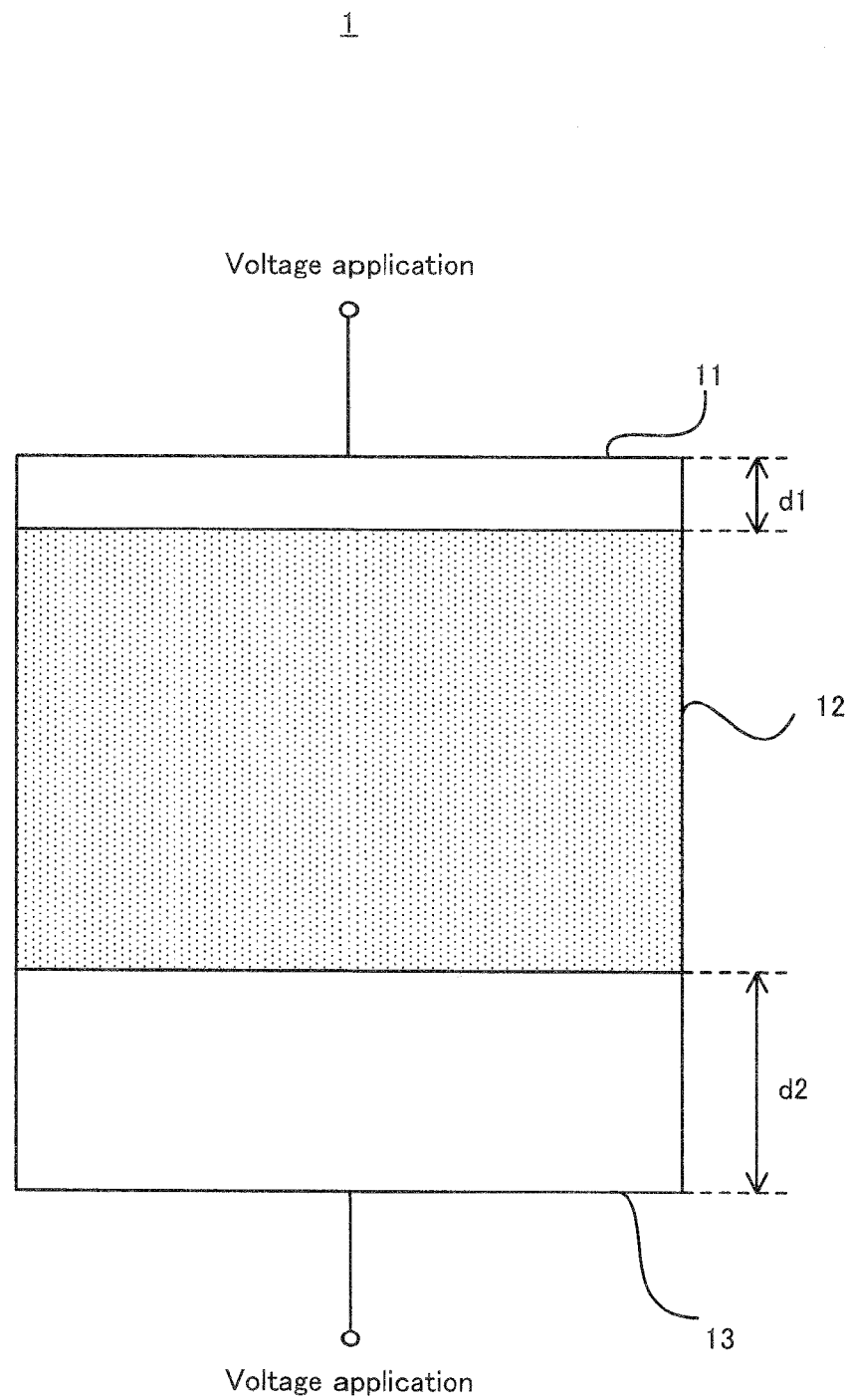

[FIG. 2]
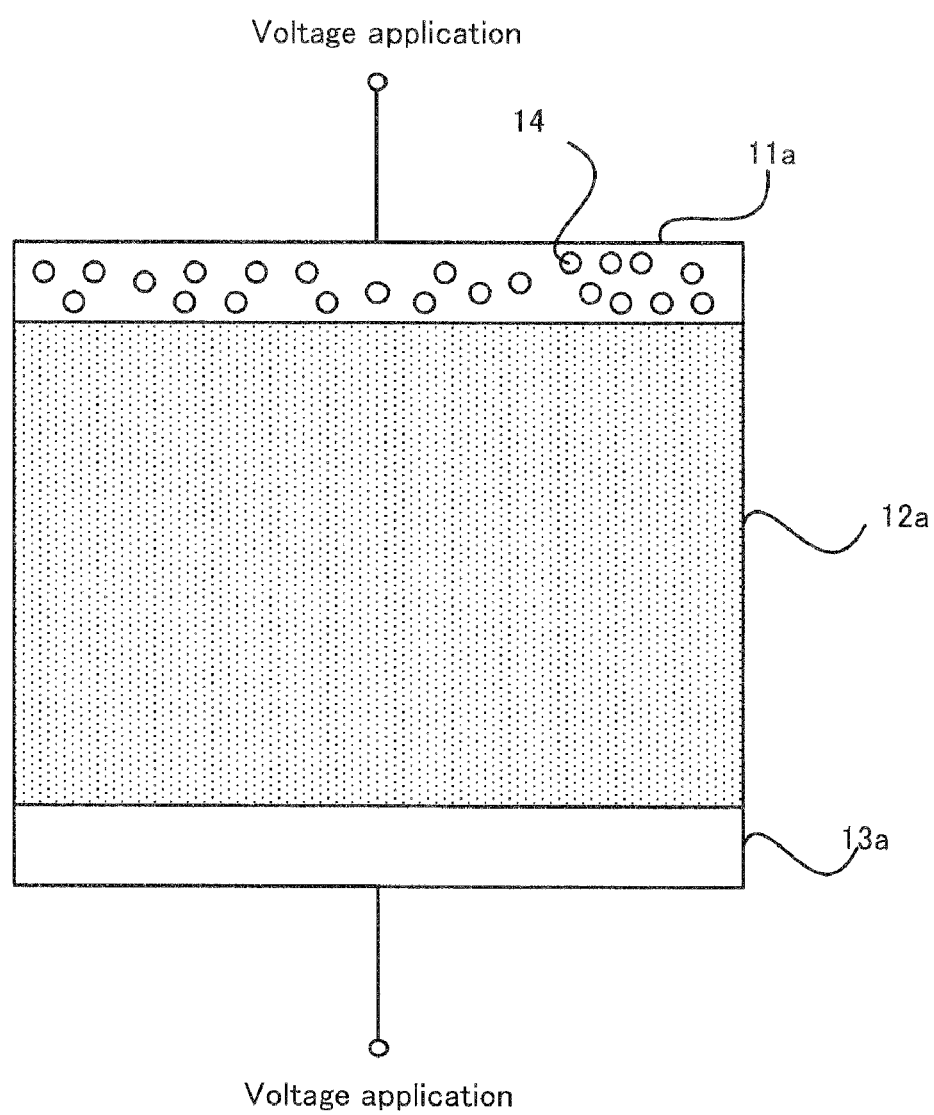

[FIG. 3]
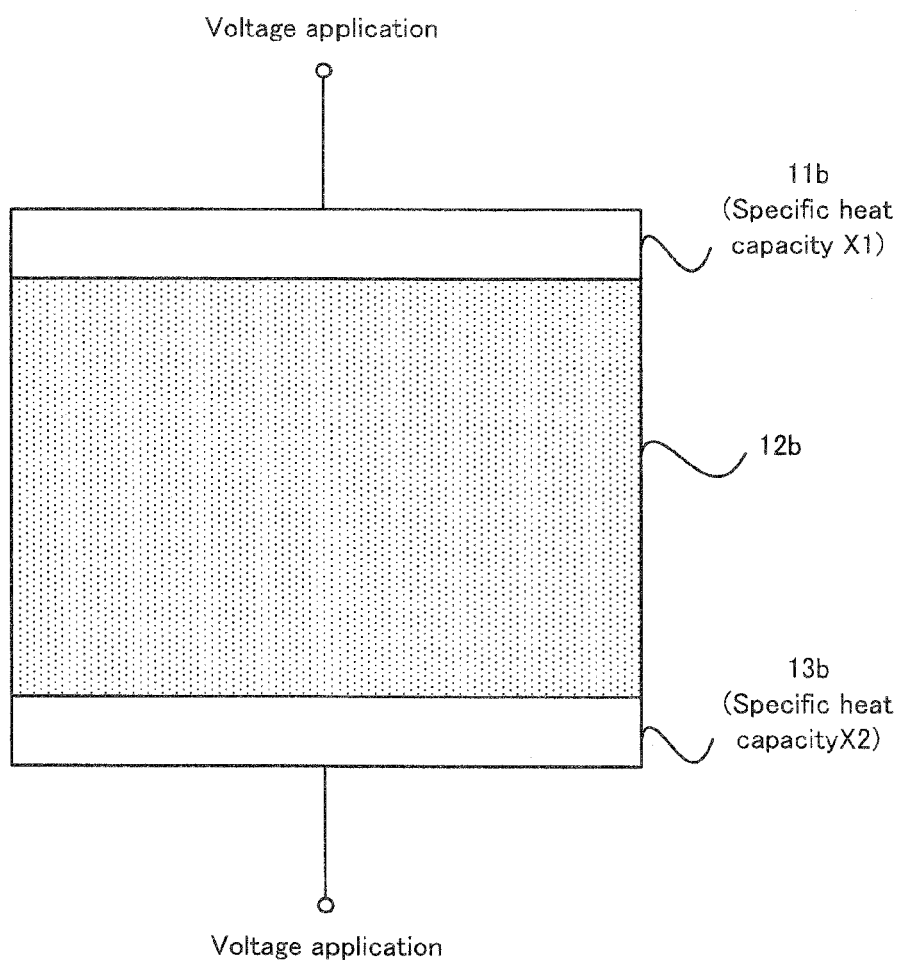

[FIG. 4]
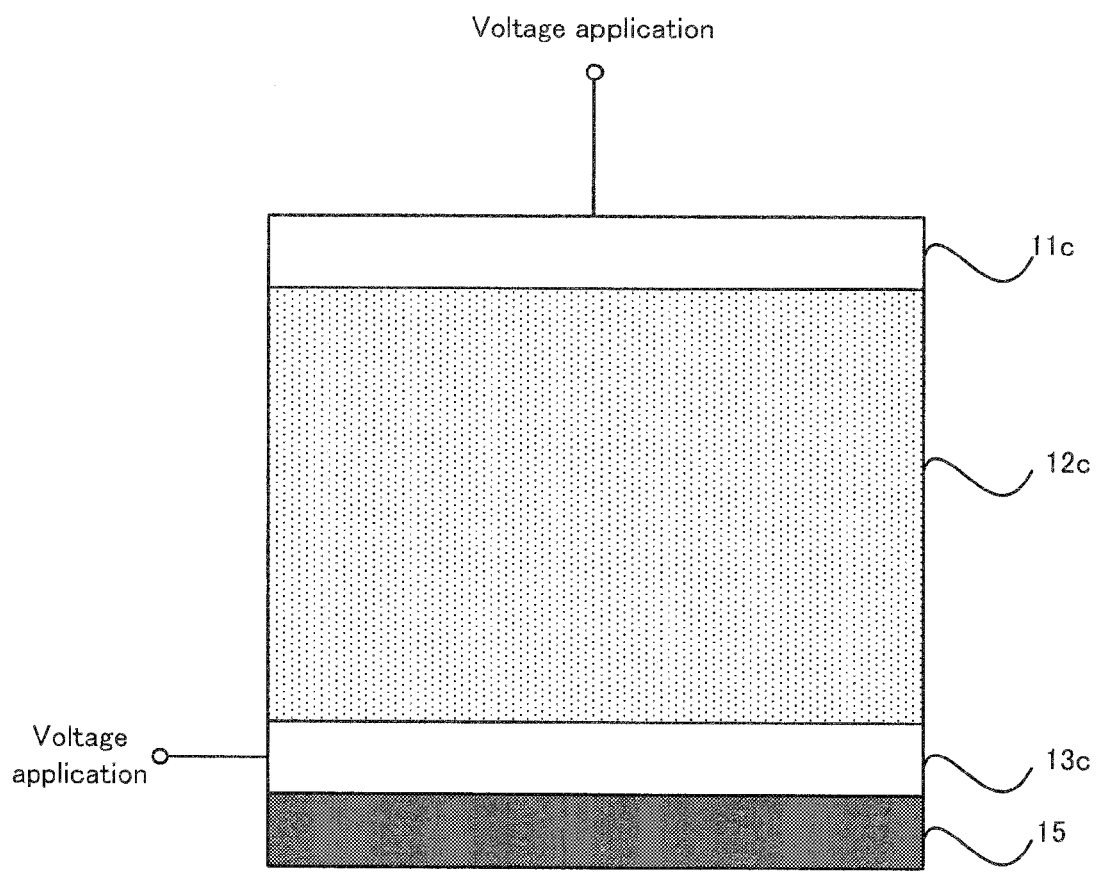

[FIG. 5]
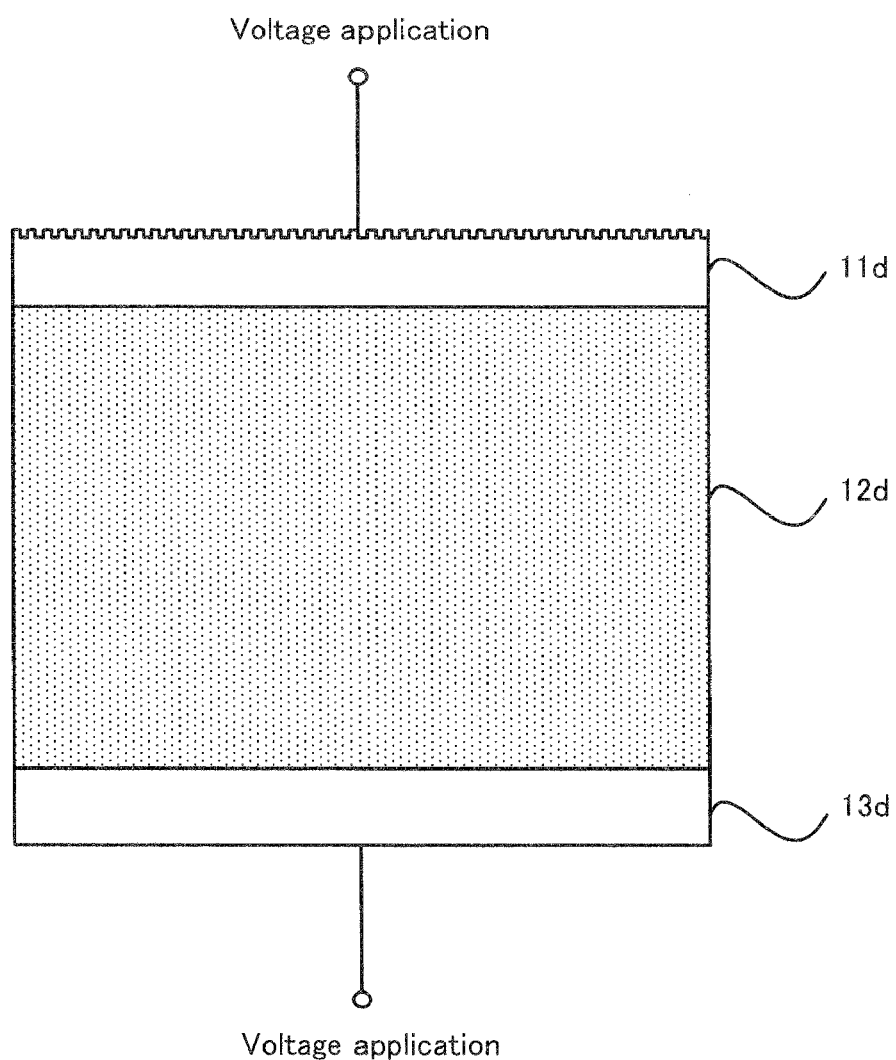

[FIG. 6]
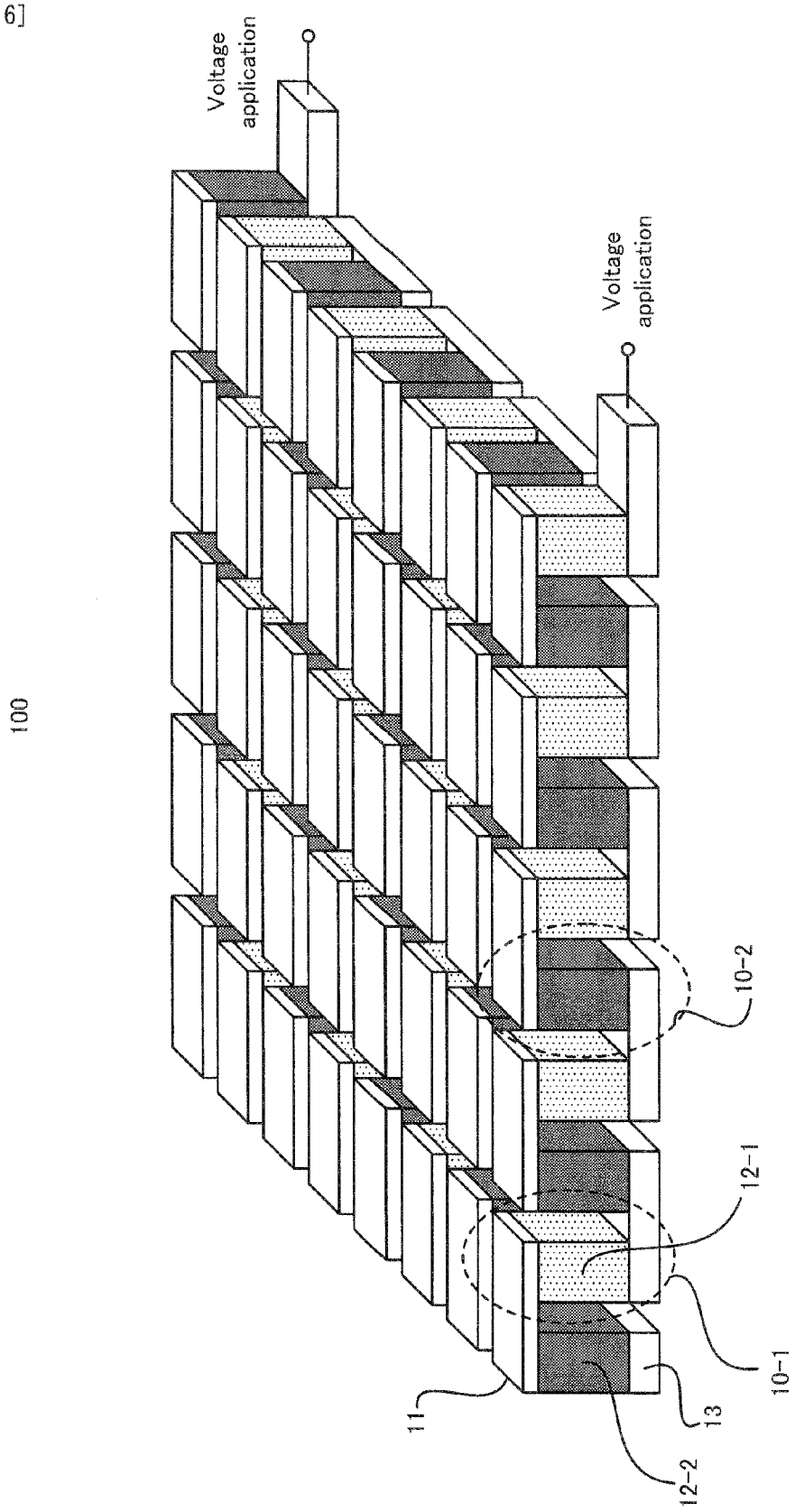

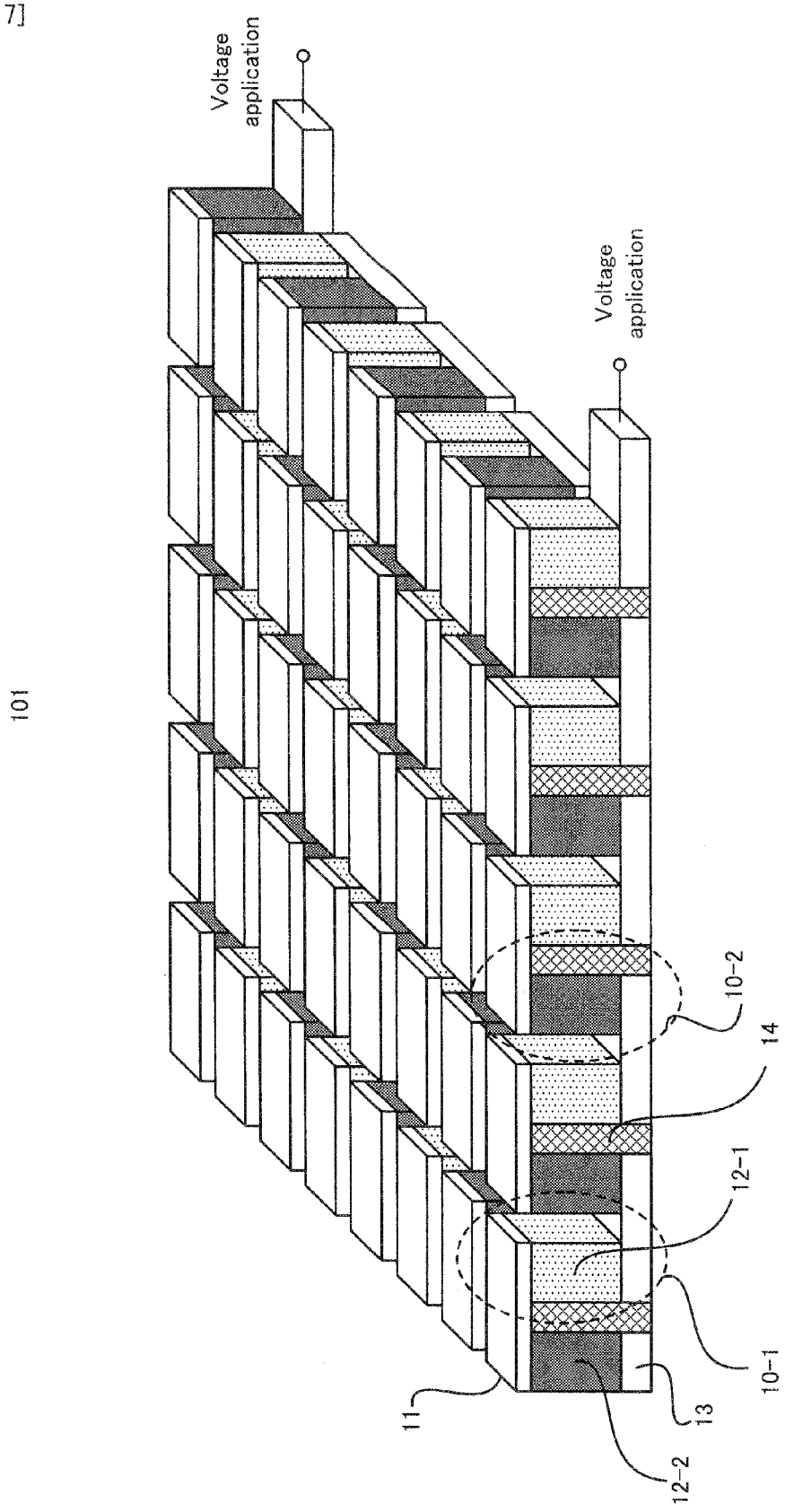

[FIG. 8]
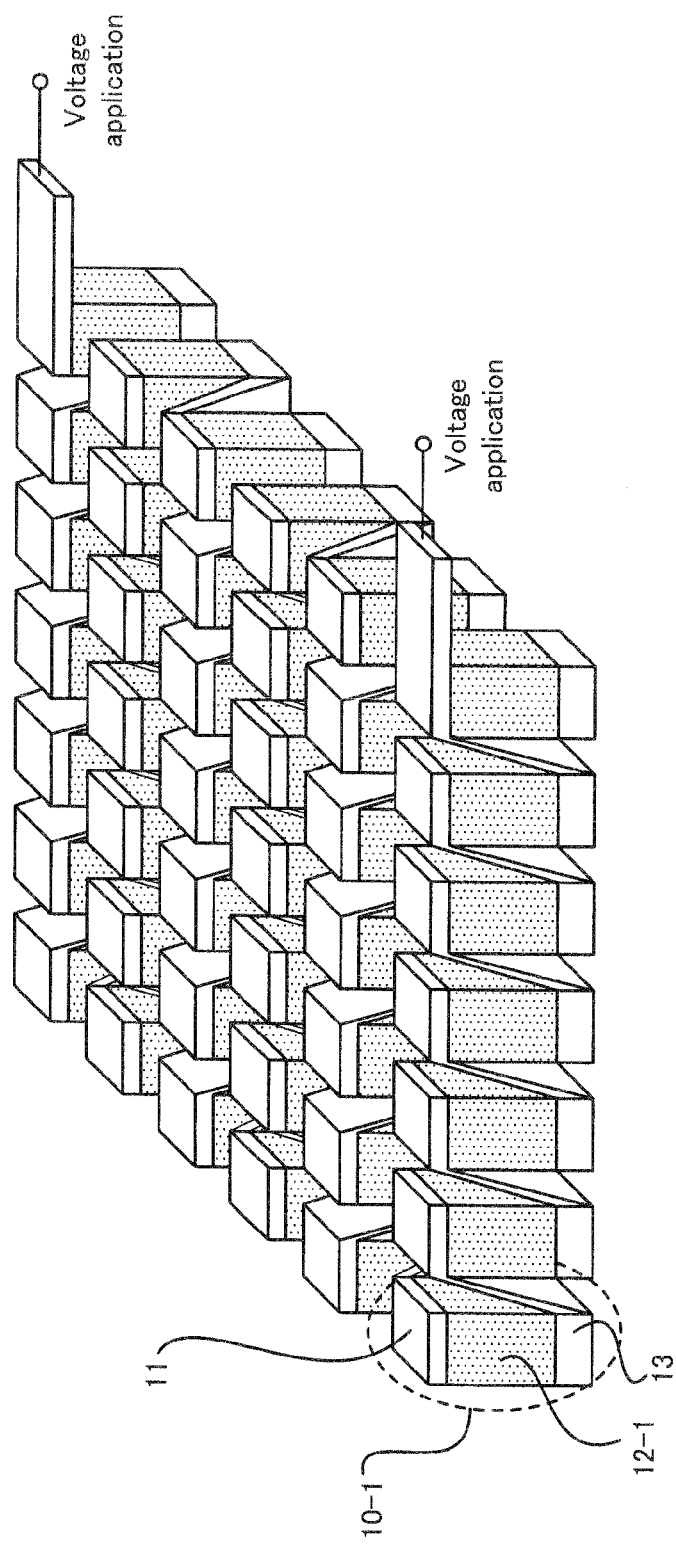

[FIG. 9]
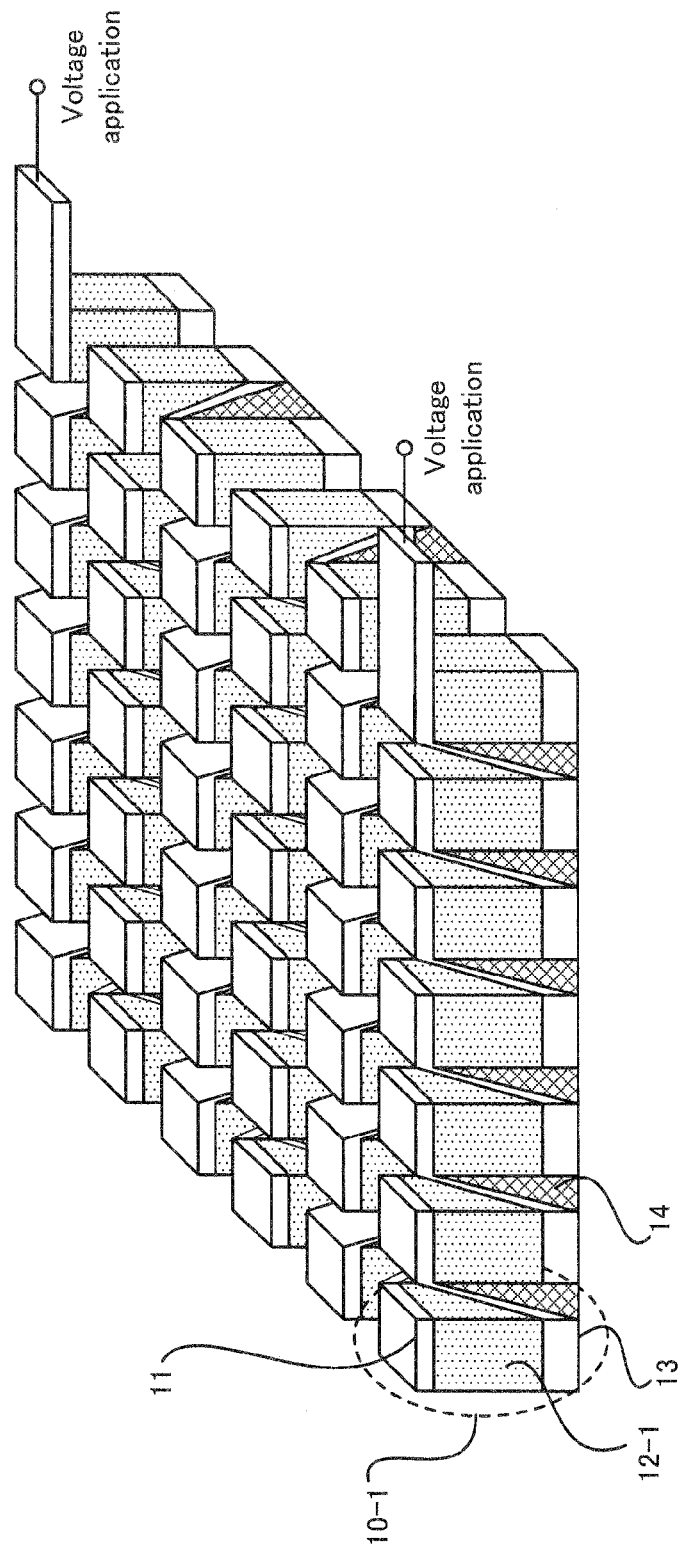

[FIG. 10]
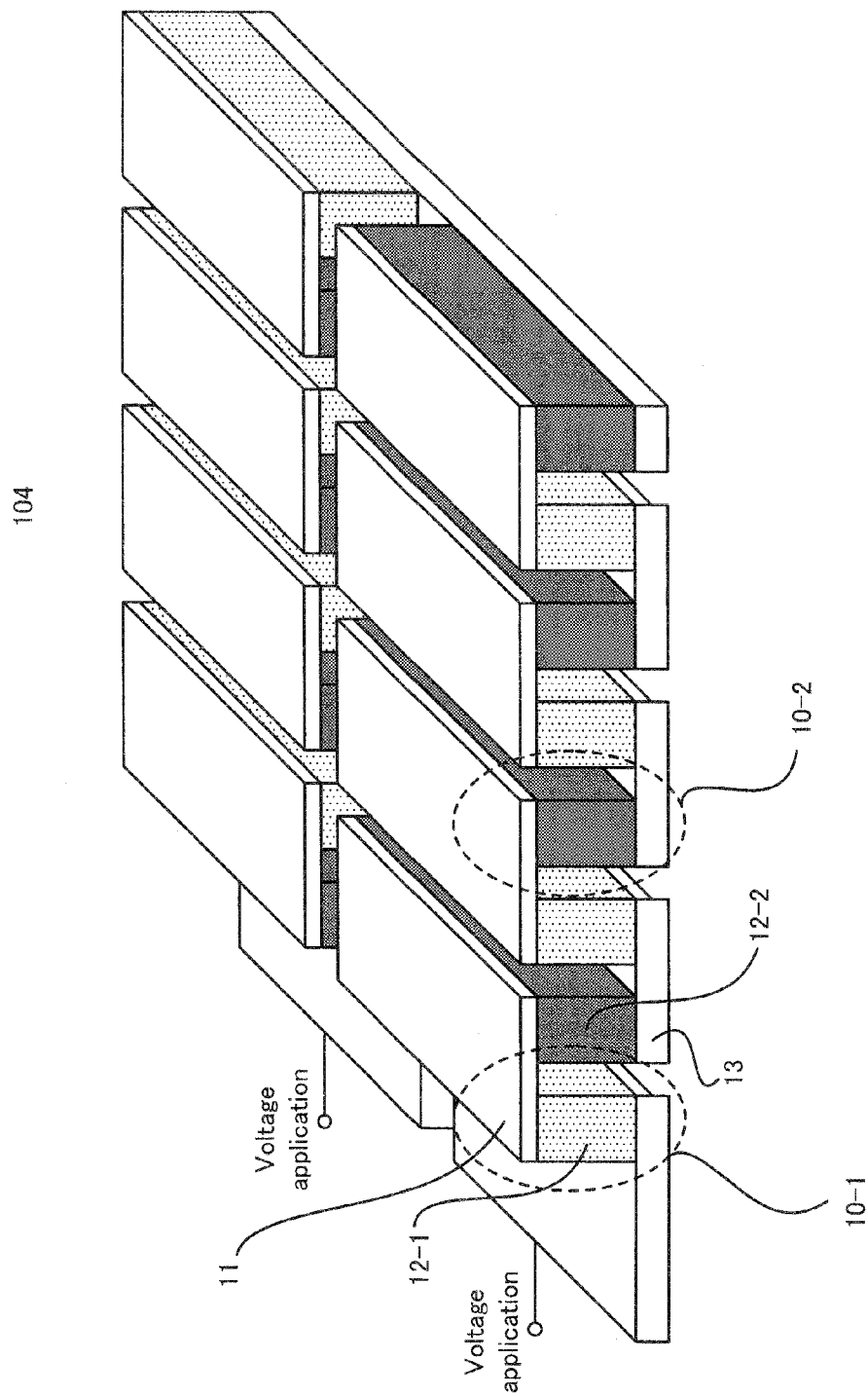

[FIG. 11]
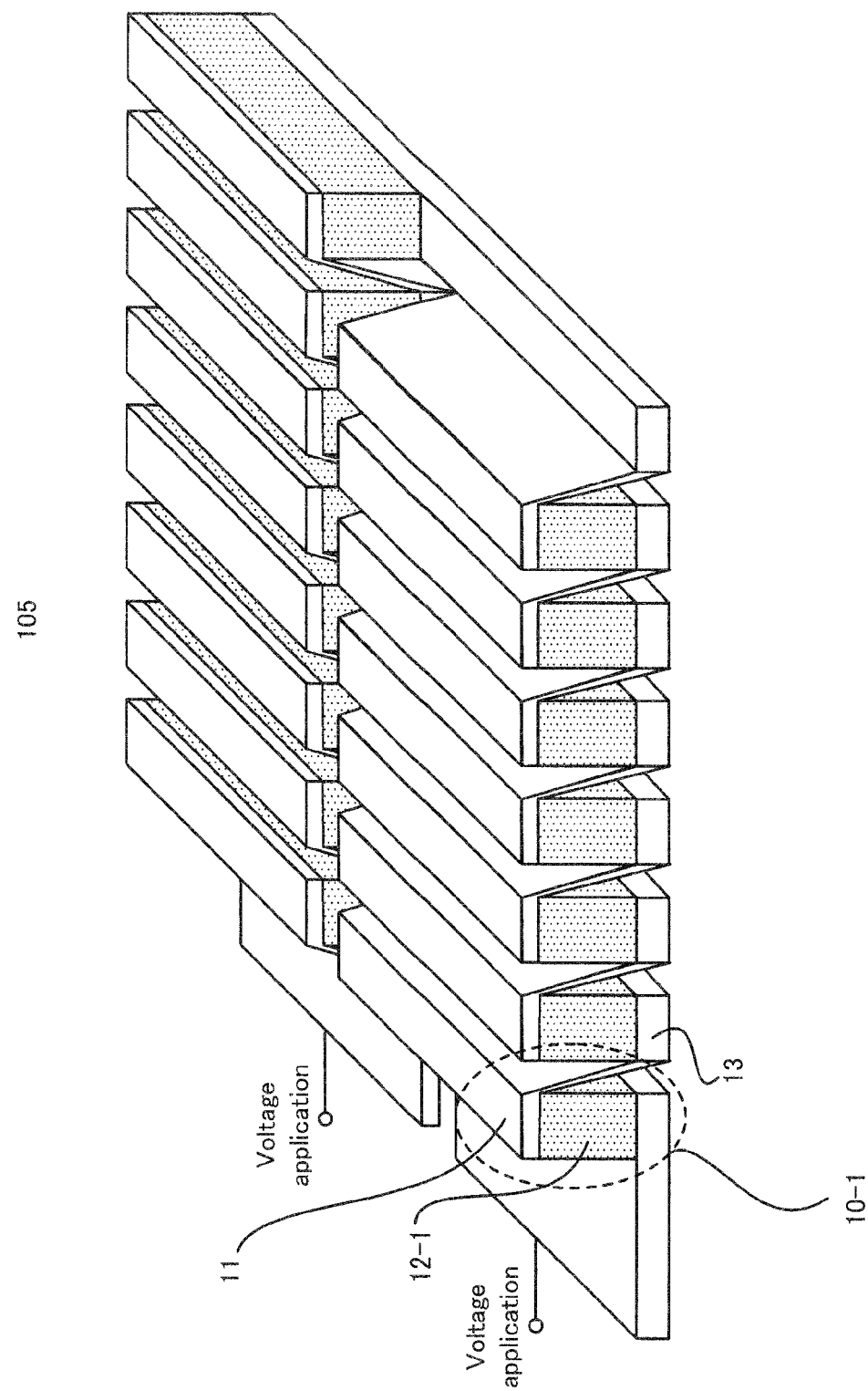

[FIG. 12]
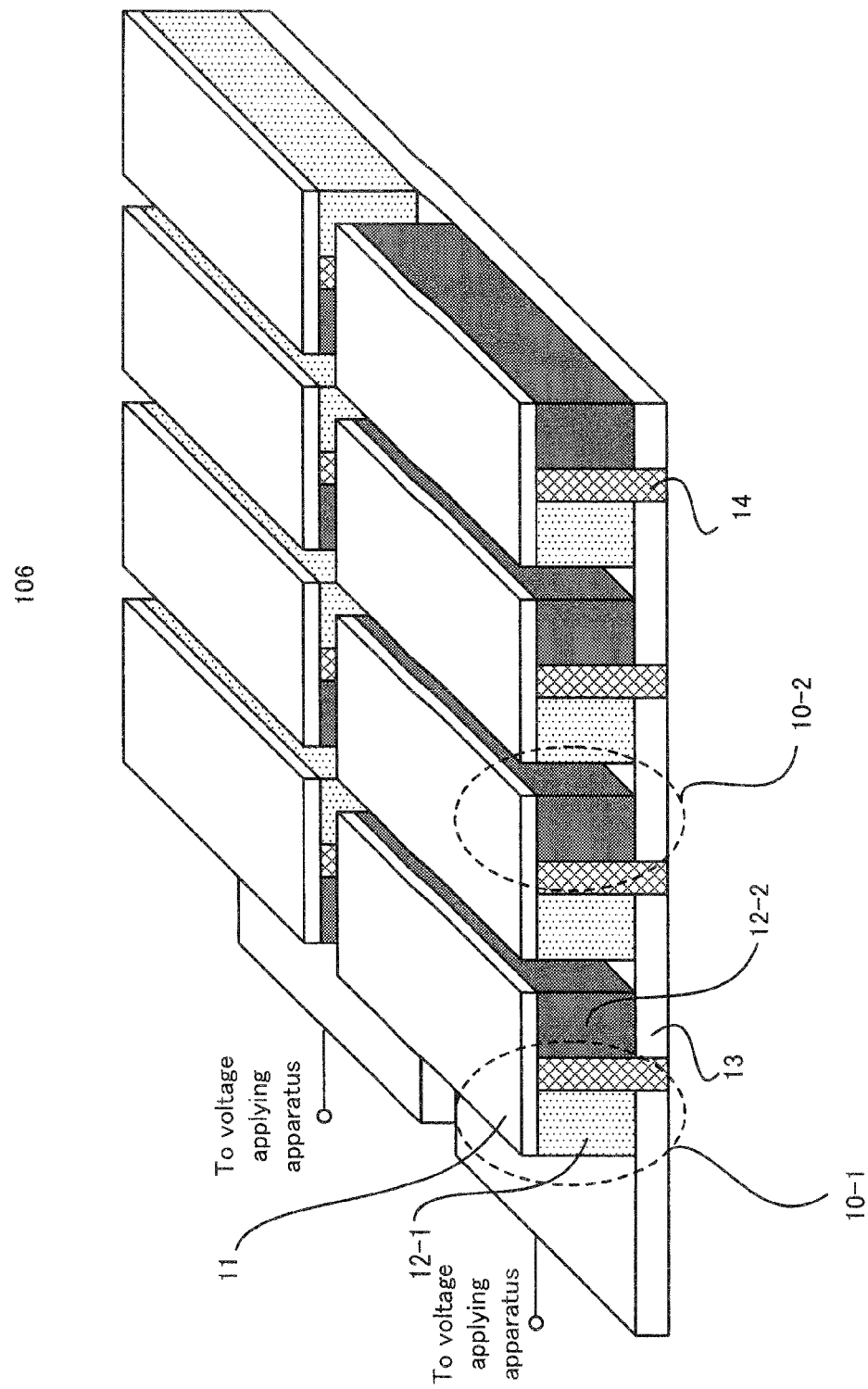

[FIG. 13]
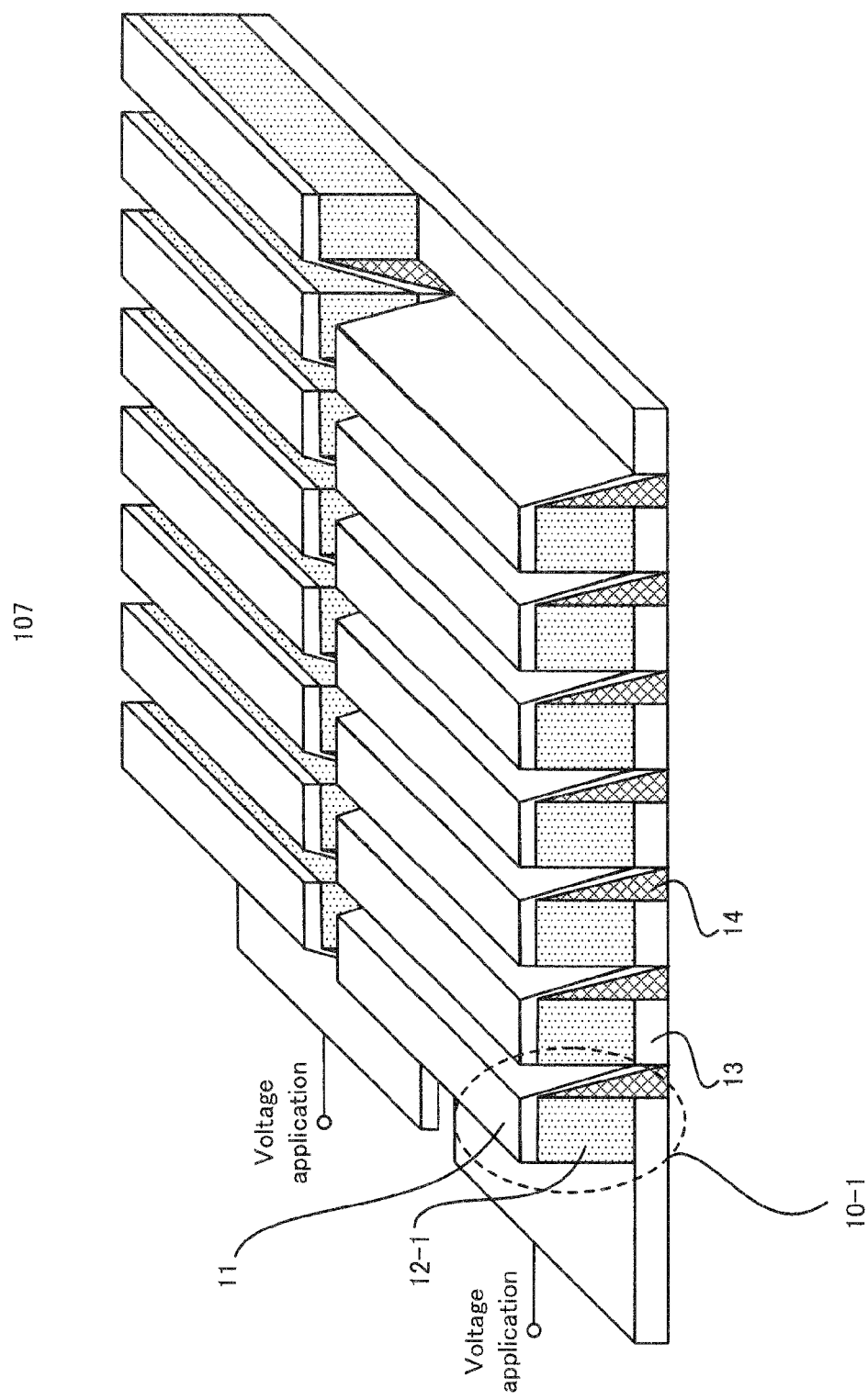

THERMAL SOUND GENERATING DEVICE

TECHNICAL FIELD

The present invention relates to, for example, a thermoacoustic generating apparatus for generating acoustic waves by temperature modulation of solids.

BACKGROUND ART

As the thermoacoustic generating apparatus, for example, patent documents 1 and 2 disclose such construction that voltage application is repeated on a resistance heating element and that Joule heat is used to temperature-modulate a thermal layer.

Patent document 1: Japanese Patent Application Laid Open No. Hei 3-140100
Patent document 2: Japanese Patent Application Laid Open No. Hei 11-300274
Patent document 3: Japanese Patent Application Laid Open No. 2005-150797

DISCLOSURE OF INVENTION

Subject to be Solved by the Invention

In such construction that the Joule heat is used for the temperature modulation, an acoustic wave signal outputted as a result of the temperature modulation is on the order of the square of an input signal inputted to control the temperature modulation. This causes such a technical problem that the acoustic wave signal which is different from the input signal is outputted. Thus, as disclosed in a patent document 3, such a technology has been suggested that a direct current signal is superimposed on an alternating current signal to generate an input signal and that an acoustic wave signal component with the same frequency as that of the input signal is outputted.

In this technology, however, it is hardly possible to completely eliminate a frequency component which is different from that of input signal (i.e. a strain component). The strain component can be reduced by increasing the direct current signal, superimposed on the alternating current signal, but this significantly reduces the generation efficiency of the acoustic waves.

On the other hand, the patent document 2 also discloses such construction that a Peltiert element is used as a heating-element thin film, in addition to the construction that the Joule heat is used for the temperature modulation. In the construction disclosed in the patent document 2, however, a heat insulating layer is under and in contact with the heating-element thin film, which is made of the Peltiert element, and an electric current is not applied to this part for driving. In this construction, the resistance of the heating-element thin film increases with respect to the electric current because the electric current flows in a direction orthogonal to the film thickness direction of the heating-element thin film (in other words, horizontally to the thickness direction or planarly), resulting in a technical problem of an increase in the generation of the Joule heat. The increased Joule heat regardless of the Peltiert element used as the heating element causes the aforementioned various problems. Moreover, because of a small contact point between the heat-element thin film and a signal terminal, it is hardly possible to obtain a large temperature change by a thermoelectric effect.

In view of the aforementioned problems, it is therefore an object of the present invention to provide, for example, a thermoacoustic generating apparatus capable of generating acoustic waves by temperature modulation, efficiently, while preventing the generation of Joule heat.

Means for Solving the Subject

The above object of the present invention can be achieved by a thermoacoustic generating apparatus, according to claim 1, for generating acoustic waves by temperature modulation of solids, provided with: a thermoelement layer; a first electrode layer, laminated on one surface of the thermoelement layer; and a second electrode layer, laminated on the other surface of the thermoelement layer located opposite to the one surface.

These operation and other advantages of the present invention will become more apparent from the embodiments explained below.

BRIEF DESCRIPTION OF DRAWINGS

FIG. 1 is a cross sectional view conceptually showing a first basic structure of a thermoacoustic generating apparatus in an example.

FIG. 2 is a cross sectional view conceptually showing a second basic structure of the thermoacoustic generating apparatus in the example.

FIG. 3 is a cross sectional view conceptually showing a third basic structure of the thermoacoustic generating apparatus in the example.

FIG. 4 is a cross sectional view conceptually showing a fourth basic structure of the thermoacoustic generating apparatus in the example.

FIG. 5 is a cross sectional view conceptually showing a structure of the thermoacoustic generating apparatus with an increased area in which an upper electrode and an ambient gas are in contact.

FIG. 6 is a perspective view conceptually showing a first basic structure of a thermoacoustic generating apparatus in a first modified example.

FIG. 7 is a perspective view conceptually showing a second structure of the thermoacoustic generating apparatus in the first modified example.

FIG. 8 is a perspective view conceptually showing a first basic structure of a thermoacoustic generating apparatus in a second modified example.

FIG. 9 is a perspective view conceptually showing a second structure of the thermoacoustic generating apparatus in the second modified example.

FIG. 10 is a perspective view conceptually showing a first basic structure of a thermoacoustic generating apparatus in a third modified example.

FIG. 11 is a perspective view conceptually showing a second basic structure of the thermoacoustic generating apparatus in the third modified example.

FIG. 12 is a perspective view conceptually showing a third structure of the thermoacoustic generating apparatus in the third modified example.

FIG. 13 is a perspective view conceptually showing a fourth structure of the thermoacoustic generating apparatus in the third modified example.

DESCRIPTION OF REFERENCE CODES 1, 100, 101, 102, 103, 104, 105 thermoacoustic generating apparatus
10 thermoacoustic generating unit
11 upper electrode
12 thermoelement 13 lower electrode
14 filler
15 supporting base

BEST MODE FOR CARRYING OUT THE INVENTION

Hereinafter, as the best mode for carrying out the present invention, an explanation will be given on embodiments of the thermoacoustic generating apparatus of the present invention.

An embodiment of the thermoacoustic generating apparatus of the present invention is a thermoacoustic generating apparatus for generating acoustic waves by temperature modulation of solids, provided with: a thermoelement layer; a first electrode layer, laminated on one surface of the thermoelement layer; and a second electrode layer, laminated on the other surface of the thermoelement layer located opposite to the one surface.

According to the embodiment of the thermoacoustic generating apparatus of the present invention, it has such a structure that the first electrode layer and the second electrode layer sandwich the thermoelement layer therebetween and that the first electrode layer, the thermoelement layer, and the second electrode layer are laminated in this order.

By applying a voltage between the first electrode layer and the second electrode layer, an electric current flows in the thermoelement layer. As a result, heat-generation or heat-absorption occurs in the boundary between the first electrode layer and the thermoelemet layer by the thermoelectric effect. In the same manner, the heat-generation or the heat-absorption occurs in the boundary between the second electrode layer and the thermoelemet layer by the thermoelectric effect. In this case, due to the nature of the thermoelement, if the heat-generation occurs in the boundary between the first electrode layer and the thermoelement layer, the heat-absorption occurs in the boundary between the second electrode layer and the thermoelement layer. On the other hand, if the heat-absorption occurs in the boundary between the first electrode layer and the thermoelement layer, the heat-generation occurs in the boundary between the second electrode layer and the thermoelement layer. This allows the heating or cooling of the first electrode layer and the second electrode layer, resulting in the heating or cooling of an ambient gas which is in contact with the first electrode layer and the second electrode layer. At this time, by controlling the voltage applied between the first electrode layer and the second electrode layer (e.g. by controlling the magnitude, sign, and the like of the voltage), i.e. by controlling the electric current flowing in the thermoelement layer (e.g. by controlling the magnitude, flowing direction, and the like of the electric current), it is possible to control the heating and cooling of the ambient gas. As a result, the acoustic waves can be generated.

In particular, in the embodiment, the first electrode layer, the thermoelement layer, and the second electrode layer have the lamination structure, and the thermoacoustic generating apparatus is driven by applying the electric current in direction of the film thickness of the thermoelement layer. Thus, electrical resistance is reduced, to thereby limiting or controlling Joule heat. Moreover, each of the first electrode layer and the second electrode layer is in planar contact with the thermoelement layer, so that the heat-generation and the heat-absorption occur in a larger area. As a result, the heat-generation and the heat-absorption can efficiently occur; namely, the acoustic waves can be generated by temperature modulation, efficiently.

Moreover, according to the embodiment, as described later, the heat-generation and the heat-absorption can occur more efficiently by adjusting the thickness or the like of the first electrode layer and the second electrode layer.

Incidentally, in the embodiment, either the heat-generation and the heat-absorption in the first electrode layer or the heat-generation and the heat-absorption in the second electrode layer may be used to generate the acoustic waves. However, the heat-generation and the heat-absorption in either the first electrode layer or the second electrode layer are preferably used to generate the acoustic waves. If the heat-generation and the heat-absorption in only the first electrode layer are used to generate the acoustic waves, it is preferably constructed such that the heat-generation and the heat-absorption in the second electrode layer do not influence on the temperature modulation by the heat-generation and the heat-absorption in the first electrode layer. In the same manner, if the heat-generation and the heat-absorption in only the second electrode layer are used to generate the acoustic waves, it is preferably constructed such that the heat-generation and the heat-absorption in the first electrode layer do not influence on the temperature modulation by the heat-generation and the heat-absorption in the second electrode layer.

In the embodiment below, an explanation will be given on such construction that the heat-generation and the heat-absorption in the first electrode layer are used to efficiently generate the acoustic waves. However, it will be understood that aspects in using the heat-generation and the heat-absorption in the first electrode layer to efficiently generate the acoustic waves, which are described later, may be applied, as occasion demands, even when the heat-generation and the heat-absorption in the second electrode layer are used to efficiently generate the acoustic waves.

In one aspect of the embodiment of the thermoacoustic generating apparatus of the present invention, a heat capacity of the first electrode layer is less than that of the second electrode layer.

According to this aspect, since the heat capacity of the first electrode layer is less, it is possible to increase a temperature change by the heat-generation and the heat-absorption in the first electrode layer. On the other hand, since the heat capacity of the second electrode layer is greater, it is possible to control or limit a temperature change by the heat-generation and the heat-absorption in the second electrode layer, thereby reducing an influence on the temperature change in the first electrode layer.

Incidentally, more preferably, the heat capacity of the first electrode layer is preferably less than or equal to $1/10$ of that of the second electrode layer.

In an aspect of the thermoacoustic generating apparatus in which the heat capacity of the first electrode layer is less than that of the second electrode layer, as described above, a film thickness of the first electrode layer may be thinner than that of the second electrode layer.

By virtue of such construction, it is possible to make the heat capacity of the first electrode layer less than that of the second electrode layer, relatively easily, by adjusting the film thickness of each of the first electrode layer and the second electrode layer, as occasion demands.

In an aspect of the thermoacoustic generating apparatus in which the heat capacity of the first electrode layer is less than that of the second electrode layer, as described above, a specific heat capacity of a material that constitutes the first electrode layer may be less than that of a material that constitutes the second electrode layer.

By virtue of such construction, it is possible to make the heat capacity of the first electrode layer less than that of the second electrode layer, relatively easily, by adjusting the material that constitutes the first electrode layer and the material that constitutes the second electrode layer, as occasion demands.

In an aspect of the thermoacoustic generating apparatus in which the heat capacity of the first electrode layer is less than that of the second electrode layer, as described above, one or a plurality of pores may be formed in the first electrode layers.

By virtue of such construction, it is possible to make the heat capacity of the first electrode layer less than that of the second electrode layer, relatively easily, by using the first electrode layer in which the one or plurality of pores are formed (i.e. the porous first electrode layer).

Incidentally, the "pore" in the present invention widely includes, in effect, a hole which penetrates the first electrode layer, a dent on the surface of the first electrode layer, and a closed gap or space formed inside the first electrode layer.

In another aspect of the embodiment of the thermoacoustic generating apparatus of the present invention, a supporting base is provided on the second electrode layer surface opposite to a side on which the second electrode layer is in contact with the thermoelement layer.

According to this aspect, the first electrode layer and the second electrode layer can have substantially the same structure, so that it is possible to substantially equalize the electrical resistance of the first electrode layer and that of the second electrode layer. This allows the electric current flowing in the thermoelement layer to have a uniform in-plane distribution, resulting in a uniform in-plane distribution in temperature in the first electrode layer. Therefore, it is possible to realize practically extremely useful construction, in that an in-plane distribution can be uniformed in an acoustic pressure generated in the first electrode layer.

Incidentally, in this aspect, the heat capacity of the first electrode layer is preferably less than the total heat capacity of the second electrode layer and the supporting base.

In another aspect of the embodiment of the thermoacoustic generating apparatus of the present invention, the thermoacoustic generating apparatus is provided with a plurality of thermoacoustic generating units, each provided with the first electrode layer, the thermoelement layer, and the second electrode layer, and the plurality of thermoacoustic generating units are electrically connected to each other to match a direction of a heat flow in all the plurality of thermoacoustic generating units, the heat flow being generated by an electric current flowing in the thermoelement layer through the first electrode layer and the second electrode layer.

According to this aspect, even if the amount of the heat-generation or the amount of the heat-absorption generated in one thermoacoustic generating unit is small with respect to the electric current flowing in the thermoelement layer, it is possible to increase the amount of the heat-generation or the amount of the heat-absorption generated as the entire thermoacoustic generating apparatus because the plurality of thermoacoustic generating units are connected. The plurality of thermoacoustic generating units are also arranged to match the direction of a generated heat flow in all the plurality of thermoacoustic generating units. More specifically, the plurality of thermoacoustic generating units are arranged to generate heat, for example, on the first electrode layer side, with respect to the electric current in a predetermined direction applied to the electrically connected thermoacoustic generating units. Thus, the thermoacoustic generating apparatus can generate the acoustic waves, more preferably.

In an aspect of the thermoacoustic generating apparatus provided with the plurality of the thermoacoustic generating units, as described above, the thermoelement layer provided for each of the plurality of thermoacoustic generating units may be provided with a thermoelement of a same conductivity type (e.g. all p-type thermoelements or all n-type thermoelements), and the first electrode layer provided for one of the plurality of thermoacoustic generating units is connected to the second electrode layer provided for another one of the plurality of thermoacoustic generating units that is adjacent to the one thermoacoustic generating unit.

As described above, by connecting the plurality of thermoacoustic generating units electrically in series, it is possible to match the direction of the generated heat flow, in all the plurality of thermoacoustic generating units, which are constructed of the same conductive type thermoelements, relatively easily.

In an aspect of the thermoacoustic generating apparatus provided with the plurality of the thermoacoustic generating units, as described above, the plurality of thermoacoustic generating units may include first thermoacoustic generating units provided with the thermoelement layer constructed of a p-type thermoelement and second thermoacoustic generating units provided with the thermoelement layer constructed of an retype thermoelement, the first thermoacoustic generating units and the second thermoacoustic generating units may be alternately arranged, and the first electrode layer provided for one of the plurality of first thermoacoustic generating units may be connected to the first electrode layer provided for one of the plurality of second thermoacoustic generating units that is adjacent to the one first thermoacoustic generating unit, and the second electrode layer provided for the one second thermoacoustic generating unit may be connected to the second electrode layer provided for another one of the plurality of first thermoacoustic generating units that is adjacent to the one second thermoacoustic generating unit.

As described above, by connecting the plurality of thermoacoustic generating units electrically in series, it is possible to match the direction of the generated heat flow, in all the plurality of thermoacoustic generating units, which are constructed of the different conductive type thermoelements, relatively easily.

In an aspect of the thermoacoustic generating apparatus provided with the plurality of the thermoacoustic generating units, as described above, a cross section substantially parallel to the first electrode layer or the second electrode layer in each of the plurality of thermoacoustic generating units may have a long side and a short side, and the first electrode layer may be connected to the first electrode layer or second electrode layer provided for another thermoacoustic generating unit adjacent to the long side.

By virtue of such construction, the electrical resistance of the thermoacoustic generating apparatus is reduced, so that it is possible to generate the acoustic waves by using the heat-generation and the heat-absorption in the first electrode layer, more efficiently.

In an aspect of the thermoacoustic generating apparatus provided with the plurality of the thermoacoustic generating units, as described above, at least one portion between the plurality of thermoacoustic generating units (e.g. an entire space between the plurality of thermoacoustic generating units, a partial space located under the first electrode layer of the space between the plurality of thermoacoustic generating units, or the like) may be filled with a filler having electrical insulation.

By virtue of such construction, the filler allows the first electrode layer, which electrically connects the adjacent thermoacoustic generating units, to be supported without floating in the air, thereby further thinning the first electrode layer. By this, it is possible to generate the acoustic waves by using the heat-generation and the heat-absorption in the first electrode layer, more efficiently. Even if the space is filled with the filler, it is possible to preferably prevent such a disadvantage that the plurality of thermoacoustic generating units electrically short-circuit outside of the first electrode layer or the second electrode layer, because the filler has the electrical insulation.

In an aspect of the thermoacoustic generating apparatus in which the space is filled with the filler, as described above, the filler preferably further has thermal insulation property.

Such construction makes it possible to preferably prevent the heat-generation or the heat-absorption of the first electrode layer from diffusing into the second electrode layer.

In another aspect of the thermoacoustic generating apparatus of the present invention, surface roughening is performed on the first electrode layer surface opposite to a side on which the first electrode layer is in contact with the thermoelement layer.

By virtue of such construction, it is possible to increase the surface area of the first electrode layer which is in contact with the ambient gas. This allows the more efficient heating and cooling of the ambient gas.

Incidentally, the "surface roughening" in the present invention may be a process of forming some unevenness on the surface of the first electrode layer, and it only needs to increase the surface area, compared to that of the first electrode layer when there is no unevenness on the surface of the first electrode layer.

These operation and other advantages of the present invention will become more apparent from the examples explained below.

As explained above, according to the embodiment of the thermoacoustic generating apparatus of the present invention, it is provided with the first electrode layer, the thermoelement layer, and the second electrode layer. Therefore, it is possible to generate the acoustic waves by temperature modulation, efficiently, while preventing the generation of Joule heat.

EXAMPLES

Hereinafter, examples of the present invention will be explained with reference to the drawings.

(1) Basic Structure

Firstly, with reference to FIG. 1, an explanation will be given on an example of the thermoacoustic generating apparatus of the present invention. FIG. 1 is a cross sectional view conceptually showing a first basic structure of a thermoacoustic generating apparatus 1 in an example.

As shown in FIG. 1, the thermoacoustic generating apparatus 1 in the example is provided with an upper electrode 11, which constitutes one specific example of the "first electrode layer" of the present invention; a thermoelement 12, which constitutes one specific example of the "thermoelement layer" of the present invention; and a lower electrode 13, which constitutes one specific example of the "second electrode layer" of the present invention.

The upper electrode 11 is, for example, an electrode made of metal or the like with a film thickness of d1. More specifically, for example, the upper electrode 11 is formed by laminating gold with a film thickness of approximately 200 nm and nickel with a film thickness of approximately 20 nm such that the nickel is adjacent to the thermoelement 12 and that the gold is in contact with an ambient gas.

The thermoelement 12 is made of a semiconductor having a thermoelectric effect (e.g. Peltier effect, Seebeck effect, and the like). More specifically, the thermoelement 12 is made of, for example, BiSbTe, BiSbTeSe, or the like. For example, the thermoelement 12 is made of p-type $Bi_{0.5}Sb_{1.5}Te_3$ or n-type $Bi_{1.8}Sb_{0.2}Te_{2.85}Se_{0.15}$. The material that constitutes the thermoelement 12 is not limited to these but may be another semiconductor, metal, oxide, and the like which provide the thermoelectric effect.

The lower electrode 13 is, for example, an electrode made of metal or the like with a film thickness of d2 (wherein d2>d1). More specifically, for example, the lower electrode 13 is formed by laminating nickel with a film thickness of approximately 20 nm, gold with a film thickness of approximately 200 nm, and copper with a film thickness of 50 μm in this order from the closest to the thermoelement 12. The materials that constitute the upper electrode 11 and the lower electrode 13 are not limited to this but may be another metal which provide ohmic contact with the thermoelement 12.

The thermoacoustic generating apparatus 1 in the example is driven by applying an input voltage, which is an alternating current voltage according to an acoustic wave signal desired to be generated, between the upper electrode 11 and the lower electrode 13.

According to the thermoacoustic generating apparatus 1 having such a structure, the application of an input voltage between the upper electrode 11 and the lower electrode 13 allows an electric current according to the input voltage to flow in the thermoelement 12. As a result, heat is generated or absorbed by the thermoelectric effect in the boundary between the upper electrode 11 and the thermoelement 12. In the same manner, heat is generated or absorbed by the thermoelectric effect in the boundary between the lower electrode 13 and the thermoelement 12.

This allows the heating or cooling of the upper electrode 11, resulting in the heating or cooling of the ambient gas in contact with the upper electrode 11. As a result, it is possible to generate acoustic waves according to the heating and cooling of the upper electrode 11 (in other words, according to the input voltage applied between the upper electrode 11 and the lower electrode 13); namely, it is possible to generate acoustic waves by temperature-modulating the thermoelement 12 in accordance with the input voltage applied between the upper electrode 11 and the lower electrode 13.

Here, due to the nature of the thermoelement 12, if heat is generated in the boundary between the upper electrode 11 and the thermoelement 12, heat is absorbed in the boundary between the lower electrode 13 and the thermoelement 12 as much as heat generated in the boundary between the upper electrode 11 and the thermoelement 12. On the other hand, if heat is absorbed in the boundary between the upper electrode 11 and the thermoelement 12, heat is generated in the boundary between the lower electrode 13 and the thermoelement 12 as much as heat absorbed in the boundary between the upper electrode 11 and the thermoelement 12. Thus, the heating and cooling of the upper electrode 11 are likely canceled by the heating and cooling of the lower electrode 13. As a result, there is a possibility that it is hardly possible to preferably generate the acoustic waves according to the input voltage. Alternatively, the acoustic waves generated by a temperature change of the lower electrode 13 are in antiphase to those on the upper electrode side, so that the acoustic waves generated in the upper electrode 11 are likely canceled by the acoustic waves in antiphase generated in the lower electrode 13.

In order to prevent such a disadvantage, according to the example, the film thickness d1 of the upper electrode 11 is less than the film thickness d2 of the lower electrode 13. This makes the heat capacity of the upper electrode 11 less than that of the lower electrode 13. Here, the heat capacity of the upper electrode 11 is preferably less than or equal to about 1/10 of the heat capacity of the lower electrode 13. As a result, it is possible to reduce the extent of the heating and cooling (specifically, a temperature rising amount and a temperature dropping amount, a temperature rising speed and a temperature dropping speed, and the like) of the lower electrode 13, with respect to the extent of the heating and cooling of the upper electrode 11. In other words, it is possible to limit or control the temperature change of the lower electrode 13, with respect to the temperature change of the upper electrode 11. By this, it is possible to preferably prevent such a disadvantage that the temperature change of the upper electrode 11 is canceled by the temperature change of the lower electrode 13. Thus, it is possible to preferably generate the acoustic waves according to the input voltage, in the upper electrode 11.

In addition, in the example, the upper electrode 11, the thermoelement 12, and the lower electrode 13 have the lamination structure, so the electric current flows in a direction along the film thickness direction of the thermoelement 12 (specifically, in the vertical direction in FIG. 1). Thus, electrical resistance of the thermoelement 12 can be reduced. Thus, Joule loss is reduced, which makes it possible to efficiently generate the acoustic waves. Moreover, it is possible to limit an influence of Joule heat, which is on the order of the square of an input signal, so that it is possible to preferably generate the acoustic waves faithful to the input signal.

Moreover, each of the upper electrode 11 and the lower electrode 13 is in contact with the thermoelement 12 in a planarly large contact area, so that heat can be generated and absorbed in a larger area. As a result, heat can be efficiently generated and absorbed by the thermoelectric effect; namely, it is possible to efficiently temperature-modulate the upper electrode 11 and to more efficiently generate the acoustic waves.

Incidentally, in the thermoacoustic generating apparatus 1 shown in FIG. 1, the heat capacity of the upper electrode 11 is less than or equal to about 1/10 of the heat capacity of the lower electrode 13. However, even if the heat capacity of the upper electrode 11 is greater than about 1/10 of the heat capacity of the lower electrode 13, it is possible to appropriately receive the effect that the acoustic waves according to the input voltage applied between the upper electrode 11 and the lower electrode 13 can be preferably generated in the upper electrode 11.

Moreover, in the thermoacoustic generating apparatus 1 shown in FIG. 1, the heating and/or cooling of the upper electrode 11 is used to generate the acoustic waves. Instead of the heating and/or cooling of the upper electrode 11, however, the heating and/or cooling of the lower electrode 13 maybe used to generate the acoustic waves. In this case, however, the heat capacity of the lower electrode 13 is preferably less than that of the upper electrode 11. For example, the film thickness d2 of the lower electrode 13 is preferably thinner than the film thickness d1 of the upper electrode 11.

Moreover, in the thermoacoustic generating apparatus 1 shown in FIG. 1, the heat capacity of the upper electrode 11 is less than that of the lower electrode 13 by making the film thickness d1 of the upper electrode 11 thinner than the film thickness d2 of the lower electrode 13. However, in addition to or instead of making the film thickness d1 of the upper electrode 11 thinner than the film thickness d2 of the lower electrode 13, the structures shown in FIG. 2 and FIG. 3 may allow the heat capacity of the upper electrode 11 to be reduced from the heat capacity of the lower electrode 13. FIG. 2 is a cross sectional view conceptually showing a second basic structure of the thermoacoustic generating apparatus in the example. FIG. 3 is a cross sectional view conceptually showing a third basic structure of the thermoacoustic generating apparatus in the example.

As shown in FIG. 2, in a thermoacoustic generating apparatus 1a, an upper electrode 11a has a porous structure. More specifically, the upper electrode 11a has a predetermined gap or space formed therein, a dent formed on its surface, or a through hole formed, which penetrates its cross section.

This makes the heat capacity of the upper electrode 11a less than that of a lower electrode 13a. Thus, it is possible to limit or control the temperature change of the lower electrode 13a, with respect to the temperature change of the upper electrode 11a. By this, it is possible to preferably prevent such a disadvantage that the temperature change of the upper electrode 11a is canceled by the temperature change of the lower electrode 13a. Thus, it is possible to preferably generate the acoustic waves according to the input voltage, in the upper electrode 11a.

Incidentally, both the thermoacoustic generating apparatus 1 shown in FIG. 1 and the thermoacoustic generating apparatus 1a shown in FIG. 2 have such construction that the volume of the upper electrode 11 is less than that of the lower electrode 13. In other words, the construction shown in FIG. 1 is FIG. 2 is summarized as follows: it is preferable to make the volume of the upper electrode 11 less than that of the lower electrode 13 in order to make the heat capacity of the upper electrode 11 less than that of the lower electrode 13.

As shown in FIG. 3, in a thermoacoustic generating apparatus 1b, a specific heat capacity X1 of the material that constitutes an upper electrode 11b is less than a specific heat capacity X2 of the material that constitutes a lower electrode 13b.

This makes the heat capacity of the upper electrode 11b less than that of the lower electrode 13b. Thus, it is possible to limit or control the temperature change of the lower electrode 13b, with respect to the temperature change of the upper electrode 11b. By this, it is possible to preferably prevent such a disadvantage that the temperature change of the upper electrode 11b is canceled by the temperature change of the lower electrode 13b. Thus, it is possible to preferably generate the acoustic waves according to the input voltage, in the upper electrode 11b.

As shown in FIG. 4, in a thermoacoustic generating apparatus 1c, a supporting base 15 is laminated on a surface opposite to a surface of a lower electrode 13c on which the lower electrode 13c is in contact with the thermoelement 12. Moreover, the heat capacity of the upper electrode 11c is less than the entire heat capacity of the lower electrode 11c and the supporting base 15.

By this, it is possible to limit or control the temperature change of the lower electrode 13c, with respect to the temperature change of the upper electrode 11c. By this, it is possible to preferably prevent such a disadvantage that the temperature change of the upper electrode 11c is canceled by the temperature change of the lower electrode 13c. Thus, it is possible to preferably generate the acoustic waves according to the input voltage, in the upper electrode 11c.

In addition, the upper electrode 11c and the lower electrode 13c can have substantially the same structure, so that it is possible to substantially equalize the electrical resistance of the upper electrode 11c and that of the lower electrode 13c. This allows the electric current flowing in a thermoelement 12c to have a uniform in-plane distribution, resulting in a uniform in-plane distribution in temperature in the upper electrode 11e. Therefore, it is possible to realize practically extremely useful construction, in that an in-plane distribution can be uniformed in an acoustic pressure generated in the upper electrode 11c.

Incidentally, in the thermoacoustic generating apparatus 1 shown in FIG. 1 to FIG. 4, the acoustic waves are generated by using the heating and/or cooling of the ambient gas, which is in contact with the upper electrode 11 and which is caused by the heating and/or cooling of the upper electrode 11. Thus, if the contact area between the upper electrode 11 and the ambient gas is increased, it is possible to further accelerate the heating and cooling of the ambient gas, which is in contact with the upper electrode 11.

As one example for increasing the contact area between the upper electrode 11 and the ambient gas, for example, a structure shown in FIG. 5 is listed. FIG. 5 is a cross sectional view conceptually showing a structure of the thermoacoustic generating apparatus with an increased area in which the upper electrode 11 and the ambient gas are in contact.

As shown in FIG. 5, unevenness is formed by performing surface roughening on the surface of an upper electrode 11d of a thermoacoustic generating apparatus 1d. This can increases the surface area of the upper electrode 11d. Therefore, it is possible to increase the contact area between the upper electrode 11d and the ambient gas, thereby further accelerating the heating and cooling of the ambient gas, which is in contact with the upper electrode 11. This makes it possible to efficiently generate the acoustic waves according to the input voltage, in the upper electrode 11d.

Incidentally, as long as the surface area of the upper electrode 11d (more specifically, the contact area between the upper electrode 11d and the ambient gas) can be increased, compared to the surface area under the assumption that the upper electrode 11d has a smooth surface without unevenness, a structure other than the unevenness shown in FIG. 5 may be formed on the surface of the upper electrode 11d. For example, the same effect can be obtained by providing the porous structure for the upper electrode 11d.

(2) First Modified Example

Next, with reference to FIG. 6 and FIG. 7, an explanation will be given on a first modified example of the thermoacoustic generating apparatus in the example. FIG. 6 is a perspective view conceptually showing a first basic structure of a thermoacoustic generating apparatus in the first modified example. FIG. 7 is a perspective view conceptually showing a second structure of the thermoacoustic generating apparatus in the first modified example.

As shown in FIG. 5, a thermoacoustic generating apparatus 100 in the first modified example is provided with a plurality of thermoacoustic generating units 10. Each of the plurality of thermoacoustic generating units 10 has substantially the same structure as those of the thermoacoustic generating apparatuses 1 shown in FIG. 1 to FIG. 4 and is provided with the upper electrode 11, the thermoelement 12, and the lower electrode 13.

In the thermoacoustic generating apparatus 100 in the first modified example, in particular, a p-type thermoelement 12-1 and an n-type thermoelement 12-2 are used as the thermoelement 12. A thermoacoustic generating unit 10 provided with the p-type thermoelement 12-1 (hereinafter referred to as a "p-type thermoacoustic generating unit 10-1" as occasion demands) and a thermoacoustic generating unit 10 provided with the n-type thermoelement 12-2 (hereinafter referred to as an "n-type thermoacoustic generating unit 10-2" as occasion demands) are arranged to match the direction of the heat-generation and the heat-absorption in each of the plurality of thermoacoustic generating apparatuses 10, with respect to the application of the input voltage. More specifically, the plurality of thermoacoustic generating apparatuses 10 are arranged such that if the upper electrodes 11 of the p-type thermoacoustic generating units 10-1 are heated, the upper electrodes 11 of the n-type thermoacoustic generating units 10-2 are also heated. In the same manner, the plurality of thermoacoustic generating units 10 are arranged such that if the upper electrodes 11 of the p-type thermoacoustic generating unit 10-1 are cooled, the upper electrodes 11 of the n-type thermoacoustic generating units 10-2 are also cooled.

Here, the upper electrode 11 of the p-type thermoacoustic generating unit 10-1 and the upper electrode 11 of the adjacent n-type thermoacoustic generating unit 10-2 are unified. In the same manner, the lower electrode 13 of the p-type thermoacoustic generating unit 10-1 and the lower electrode 13 of another adjacent n-type thermoacoustic generating unit 10-2 are unified. In other words, a plurality of p-type thermoacoustic generating units 10-1 and a plurality of n-type thermoacoustic generating units 10-2 are alternately connected to be electrically in series.

Here, the p-type thermoacoustic generating unit 10-1, provided with the upper electrode 11 and the lower electrode 13 with a Peltier constant $\pi_m$ and the p-type thermoelement 12-1 with a Peltier constant $\pi_p$, provides the amount of the heat-absorption $Q_p = (\pi_p - \pi_m) \times I$ when an electric current I is applied from the upper electrode 11 to the lower electrode 13. In the same manner, the p-type thermoacoustic generating unit 10-1 provides the amount of the heat-generation $Q_p = (\pi_p - \pi_m) \times I$ when the electric current I is applied from the lower electrode 13 to the upper electrode 11. On the other hand, the n-type thermoacoustic generating unit 10-2, provided with the upper electrode 11 and the lower electrode 13 with a Peltier constant $\pi_m$ and the n-type thermoelement 12-1 with a Peltier constant $\pi_n$, provides the amount of the heat-absorption $Q_n = (\pi_n + \pi_m) \times I$ when the electric current I is applied from the lower electrode 13 to the upper electrode 11. In the same manner, the n-type thermoacoustic generating unit 10-2 provides the amount of the heat-generation $Q_n = (\pi_n + \pi_m) \times I$ when the electric current I is applied from the upper electrode 11 to the lower electrode 13.

Therefore, the amount of the heat-absorption and the heat-generation by one pair of the p-type thermoacoustic generating unit 10-1 and the n-type thermoacoustic generating unit 10-2 is $Q = Q_p + Q_n = (\pi_p + \pi_n) \times I$. Thus, if m (wherein m is an integer of 1 or more) pairs of the p-type thermoacoustic generating units 10-1 and the n-type thermoacoustic generating units 10-2 are connected, the amount of the heat-absorption and the heat-generation of the entire thermoacoustic generating apparatus 100 is $Q_{total} = m \times Q = m \times (\pi_p + \pi_n) \times I$.

As described above, by connecting the plurality of thermoacoustic generating units 10 in series, it is possible to increase the amount of the heat-generation or the amount of the heat-absorption to be generated by the entire thermoacoustic generating apparatus 100. Thus, the thermoacoustic generating apparatus 100 can generate the acoustic waves faithful to the input signals, more preferably.

Incidentally, in the example shown in FIG. 6, the upper electrode 11 connects the p-type thermoelement 12-1 and the n-type thermoelement 12-2 without any support in its one portion. In other words, the upper electrode 11 is supported by the p-type thermoelement 12-1 and the n-type thermoelement 12-2 on the start edge and the end edge but is not supported in the intermediate part. In this case, it is hard to thin the upper electrode 11, as described in FIG. 1 or the like.

Thus, as in a thermoacoustic generating apparatus 101 shown in FIG. 7, the space that is between the p-type thermoelement 12-1 and the n-type thermoelement 12-2 and that is located under the upper electrode 11 is preferably filled with a filler 14 having electrical insulation.

This makes it possible to preferably support the upper electrode 11 even if the film thickness thereof is thinned. Moreover, even if the space is filled with the filler 14, it is possible to preferably prevent such a disadvantage that the p-type thermoacoustic generating unit 10-1 and the n-type thermoacoustic generating unit 10-2 electrically short-circuit outside of the upper electrode 11 or the lower electrode 13, because the filler 14 has the electrical insulation.

In order to increase the mechanical strength of the entire thermoacoustic generating apparatus 100, all between the thermoelements may be filled with the filler 14 having the electrical insulation.

Incidentally, the filler 14 is more preferably provided with thermal insulation, in addition to the electrical insulation. This makes it possible to preferably prevent the heat-generation or the heat-absorption of the upper electrodes 11 from diffusing into the lower electrodes 13.

(3) Second Modified Example

Next, with reference to FIG. 8 and FIG. 9, an explanation will be given on a second modified example of the thermoacoustic generating apparatus in the example. FIG. 8 is a perspective view conceptually showing a first basic structure of a thermoacoustic generating apparatus in the second modified example. FIG. 9 is a perspective view conceptually showing a second structure of the thermoacoustic generating apparatus in the second modified example.

As shown in FIG. 8, a thermoacoustic generating apparatus 102 in the second modified example is provided with the plurality of thermoacoustic generating units 10, as in the thermoacoustic generating apparatus 100 in the first modified example.

In the thermoacoustic generating apparatus 102 in the second modified example, only the p-type thermoelements 12-1 are used as the thermoelements 12. The plurality of p-type thermoacoustic generating units 10 are connected electrically in series to match the direction of a heat flow caused by the application of the electric current. Specifically, as shown in FIG. 8, the plurality of p-type thermoacoustic generating units 10 are arranged in a matrix, and the upper electrode 11 provided for the p-type thermoacoustic generating unit 10-1 is connected to the lower electrode 13 of the adjacent p-type thermoacoustic generating unit 10-1.

This allows the thermoacoustic generating apparatus 102 in the second modified example to receive the same effect as that received by the thermoacoustic generating apparatus 100 in the first modified example. More specifically, by connecting the plurality of p-type thermoacoustic generating units 10-1 in series, it is possible to increase the amount of the heat-generation or the amount of the heat-absorption to be generated by the entire thermoacoustic generating apparatus 102. Thus, the thermoacoustic generating apparatus 102 can generate the acoustic waves faithful to the input signals, more preferably.

Incidentally, FIG. 8 explains the example in which the plurality of p-type thermoacoustic generating units 10-1 are connected electrically in series; however, it will be understood that the plurality of n-type thermoacoustic generating units 10-2 may be used instead of the plurality of p-type thermoacoustic generating units 10-1.

In addition, even in the second modified example, as in a thermoacoustic generating apparatus 103 shown in FIG. 9, the space that is between the adjacent two of the plurality of p-type thermoelements 12-1 and that is located under the upper electrode 11 is preferably filled with the filler 14 having electrical insulation.

(4) Third Modified Example

Next, with reference to FIG. 10 to FIG. 13, an explanation will be given on a third modified example of the thermoacoustic generating apparatus in the example. FIG. 10 is a perspective view conceptually showing a first basic structure of a thermoacoustic generating apparatus in the third modified example. FIG. 11 is a perspective view conceptually showing a second basic structure of the thermoacoustic generating apparatus in the third modified example. FIG. 12 is a perspective view conceptually showing a third basic structure of the thermoacoustic generating apparatus in the third modified example. FIG. 13 is a perspective view conceptually showing a fourth structure of the thermoacoustic generating apparatus in the third modified example.

As shown in FIG. 10, in a thermoacoustic generating apparatus 104 in the third modified example, as in the thermoacoustic generating apparatus 100 in the first modified example, the p-type thermoacoustic generating units 10-1 and the n-type thermoacoustic generating units 10-2 are arranged to match the direction of the heat flow in each of the plurality of thermoacoustic generating units 10, caused by the application of the electric current.

In the thermoacoustic generating apparatus 104 in the third modified example, in particular, a cross section substantially parallel to the upper electrode 11 or the lower electrode 13 of the thermoelement 12 has a rectangular shape having the long side and the short side. All the upper electrodes 11 connect the p-type thermoelements 12-1 and the n-type thermoelements 12-2 which are adjacent on the long side. The p-type thermoelements 12-1 and the n-type thermoelements 12-2 which are adjacent on the short side are electrically connected by the lower electrodes 13.

This allows the thermoacoustic generating apparatus 104 in the third modified example to receive the same effect as that received by the thermoacoustic generating apparatus 100 in the first modified example. More specifically, by connecting the plurality of p-type thermoacoustic generating units 10 in series, it is possible to increase the amount of the heat-generation or the amount of the heat-absorption to be generated by the entire thermoacoustic generating apparatus 104. Thus, the thermoacoustic generating apparatus 104 can generate the acoustic waves faithful to the input signals, more preferably.

Moreover, it is possible to further limit or control the generation of Joule loss in the upper electrodes 11 and the lower electrodes 13. In addition, since the distribution of the electric current flowing in each of the thermoelements 12 can be relatively reduced, it is possible to uniform the in-plane distribution in the acoustic waves generated in the upper electrodes 11.

As shown in FIG. 11, in a thermoacoustic generating apparatus 105 in the third modified example, as in the thermoacoustic generating apparatus 100 in the first modified example, the p-type thermoacoustic generating units 10-1 are arranged to match the direction of the heat flow in each of the plurality of thermoacoustic generating units 10, caused by the application of the electric current.

In the thermoacoustic generating apparatus 105 in the third modified example, in particular, as in the thermoacoustic generating apparatus 104, the cross section substantially parallel to the upper electrode 11 or the lower electrode 13 of the thermoelement 12 has a rectangular shape having the long side and the short side. Moreover, the electrical connection of the p-type thermoelements 12-1 adjacent on the long side as shown in FIG. 11 is performed by connecting the upper electrode of one of the p-type thermoelements 12-1 and the lower electrode 13 of the other p-type thermoelement 12-1. The connection is performed such that all the p-type thermoacoustic generating units 10-1 are electrically in series.

This allows the thermoacoustic generating apparatus 105 in the third modified example to receive the same effect as that received by the thermoacoustic generating apparatus 100 in the first modified example. More specifically, by connecting the plurality of p-type thermoacoustic generating units 10 in series, it is possible to increase the amount of the heat-generation or the amount of the heat-absorption to be generated by the entire thermoacoustic generating apparatus 105. Thus, the thermoacoustic generating apparatus 105 can generate the acoustic waves faithful to the input signals, more preferably.

It is also possible to further limit or control the generation of Joule loss in the upper electrodes 11 and the lower electrodes 13. In addition, since the distribution of the electric current flowing in each of the thermoelements 12 can be relatively reduced, it is possible to uniform the in-plane distribution in the acoustic waves generated in the upper electrodes 11.

Incidentally, even in the thermoacoustic generating apparatus 104 in the third modified example, as in a thermoacoustic generating apparatus 106 shown in FIG. 12, the space that is between the p-type thermoelement 12-1 and the n-type thermoelement 12-2 and that is located under the upper electrode 11 is preferably filled with the filler 14 having the electrical insulation. In the same manner, even in the thermoacoustic generating apparatus 105 in the third modified example, as in a thermoacoustic generating apparatus 107 shown in FIG. 13, the space that is between adjacent two of the plurality of p-type thermoelements 12-1 and that is located under the upper electrode 11 is preferably filled with the filler 14 having the electrical insulation.

Moreover, in order to increase the mechanical strength of the entire thermoacoustic generating apparatus 106 or 107, all between the thermoelements may be filled with the filler 14 having the electrical insulation.

Furthermore, the thermoacoustic generating apparatuses 1 and the like explained with reference to FIG. 1 to FIG. 13, for example, can reproduce music by applying the apparatuses to speakers, or can generate ultrasonic waves by applying the apparatuses to ultrasonic-wave generators.

The present invention is not limited to the aforementioned example, but various changes may be made, if desired, without departing from the essence or spirit of the invention which can be read from the claims and the entire specification. A thermoacoustic generating apparatus, which involves such changes, is also intended to be within the technical scope of the present invention.

The invention claimed is:

1. A thermoacoustic generating apparatus for generating acoustic waves by temperature modulation of solids, comprising:
   a thermoelement layer;
   a first electrode layer, laminated on one surface of said thermoelement layer; and
   a second electrode layer, laminated on the other surface of said thermoelement layer located opposite to the one surface,
   wherein a heat capacity of said first electrode layer is less than or equal to $1/10$ of that of said second electrode layer.

2. The thermoacoustic generating apparatus according to claim 1, wherein a film thickness of said first electrode layer is thinner than that of said second electrode layer.

3. The thermoacoustic generating apparatus according to claim 1, wherein a specific heat capacity of a material that constitutes said first electrode layer is less than that of a material that constitutes said second electrode layer.

4. The thermoacoustic generating apparatus according to claim 1, wherein one or a plurality of pores are formed in said first electrode layer so that a volume of said first electrode layer is less than that of said second electrode layer.

5. The thermoacoustic generating apparatus according to claim 1, wherein a supporting base is provided on the second electrode layer surface opposite to a side on which said second electrode layer is in contact with said thermoelement layer,
   wherein a heat capacity of the first electrode layer is less than a total heat capacity of the second electrode layer and the supporting base.

6. The thermoacoustic generating apparatus according to claim 1, wherein
   said thermoacoustic generating apparatus comprises a plurality of thermoacoustic generating units, each comprising said first electrode layer, said thermoelement layer, and said second electrode layer, and
   the plurality of thermoacoustic generating units are electrically connected to each other to match a direction of a heat flow in all the plurality of thermoacoustic generating units, the heat flow being generated by an electric current flowing in said thermoelement layer through said first electrode layer and said second electrode layer.

7. The thermoacoustic generating apparatus according to claim 6, wherein
   a cross section substantially parallel to said first electrode layer or said second electrode layer in each of the plurality of thermoacoustic generating units has a long side and a short side, and
   said first electrode layer is connected to said first electrode layer or second electrode layer provided for another thermoacoustic generating unit adjacent to the long side.

8. The thermoacoustic generating apparatus according to claim 6, wherein
   said thermoelement layer provided for each of the plurality of thermoacoustic generating units comprises a thermoelement of a same conductivity type, and
   said first electrode layer provided for one of the plurality of thermoacoustic generating units is connected to said second electrode layer provided for another one of the plurality of thermoacoustic generating units that is adjacent to the one thermoacoustic generating unit.

9. The thermoacoustic generating apparatus according to claim 6, wherein
   the plurality of thermoacoustic generating units include first thermoacoustic generating units comprising said thermoelement layer constructed of a p-type thermoelement and second thermoacoustic generating units comprising said thermoelement layer constructed of an n-type thermoelement,
   the first thermoacoustic generating units and the second thermoacoustic generating units are alternately arranged, and
   said first electrode layer provided for one of the plurality of first thermoacoustic generating units is connected to said first electrode layer provided for one of the plurality of second thermoacoustic generating units that is adjacent to the one first thermoacoustic generating unit, and said second electrode layer provided for the one second thermoacoustic generating unit is connected to said second electrode layer provided for another one of the plurality of first thermoacoustic generating units that is adjacent to the one second thermoacoustic generating unit.

10. The thermoacoustic generating apparatus according to claim 6, wherein at least one portion between the plurality of thermoacoustic generating units is filled with a filler having electrical insulation property.

11. The thermoacoustic generating apparatus according to claim 10, wherein the filler further has thermal insulation.

12. The thermoacoustic generating apparatus according to claim 1, wherein surface roughening is performed on the first electrode layer surface opposite to a side on which said first electrode layer is in contact with said thermoelement layer.

* * * * *